(12) United States Patent
Krasowski et al.

(10) Patent No.: US 9,755,645 B1
(45) Date of Patent: Sep. 5, 2017

(54) CURRENT SOURCE LOGIC GATE

(71) Applicant: The United States of America as represented by the Administrator of NASA, Washington, DC (US)

(72) Inventors: Michael J. Krasowski, Chagrin Falls, OH (US); Norman F. Prokop, Shaker Heights, OH (US)

(73) Assignee: The United States of America as Represented by the Administrator of National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 15/373,689

(22) Filed: Dec. 9, 2016

Related U.S. Application Data

(60) Provisional application No. 62/266,176, filed on Dec. 11, 2015.

(51) Int. Cl.
```
H03K 19/20      (2006.01)
H03K 19/0952    (2006.01)
H03K 19/094     (2006.01)
```

(52) U.S. Cl.
CPC ... *H03K 19/0952* (2013.01); *H03K 19/09403* (2013.01); *H03K 19/20* (2013.01)

(58) Field of Classification Search
CPC .............. H03K 19/20; H03K 19/0952; H03K 19/09403
USPC .................................. 326/112, 115
See application file for complete search history.

(56) References Cited

U.S. PATENT DOCUMENTS

| | | | | |
|---|---|---|---|---|
| 3,988,616 A | * | 10/1976 | Shimada | G09G 3/18 326/120 |
| 4,521,698 A | * | 6/1985 | Taylor | H03K 19/00315 326/120 |
| 4,698,524 A | * | 10/1987 | Plagens | A61K 8/671 326/117 |
| 4,712,022 A | * | 12/1987 | Vu | H03K 19/0952 326/115 |
| 4,996,454 A | * | 2/1991 | Peczalski | H03K 19/096 326/55 |
| 5,016,430 A | * | 5/1991 | Itoh | B65B 49/08 53/211 |
| 5,030,852 A | * | 7/1991 | Higashisaka | H03K 19/0952 326/114 |
| 5,656,956 A | * | 8/1997 | Ohta | H03K 19/0952 326/112 |
| 5,705,940 A | * | 1/1998 | Newman | H03K 19/0952 326/112 |

(Continued)

*Primary Examiner* — Don Le
(74) *Attorney, Agent, or Firm* — Robert H. Earp, III

(57) ABSTRACT

A current source logic gate with depletion mode field effect transistor ("FET") transistors and resistors may include a current source, a current steering switch input stage, and a resistor divider level shifting output stage. The current source may include a transistor and a current source resistor. The current steering switch input stage may include a transistor to steer current to set an output stage bias point depending on an input logic signal state. The resistor divider level shifting output stage may include a first resistor and a second resistor to set the output stage point and produce valid output logic signal states. The transistor of the current steering switch input stage may function as a switch to provide at least two operating points.

20 Claims, 5 Drawing Sheets

(56) References Cited

U.S. PATENT DOCUMENTS

| | | | |
|---|---|---|---|
| 2012/0312881 A1* | 12/2012 | Ochoa | G06K 19/0715 235/492 |
| 2014/0266314 A1* | 9/2014 | Iriarte | H03K 5/2472 327/81 |
| 2015/0280713 A1* | 10/2015 | Jung | H03K 19/00361 326/34 |

* cited by examiner

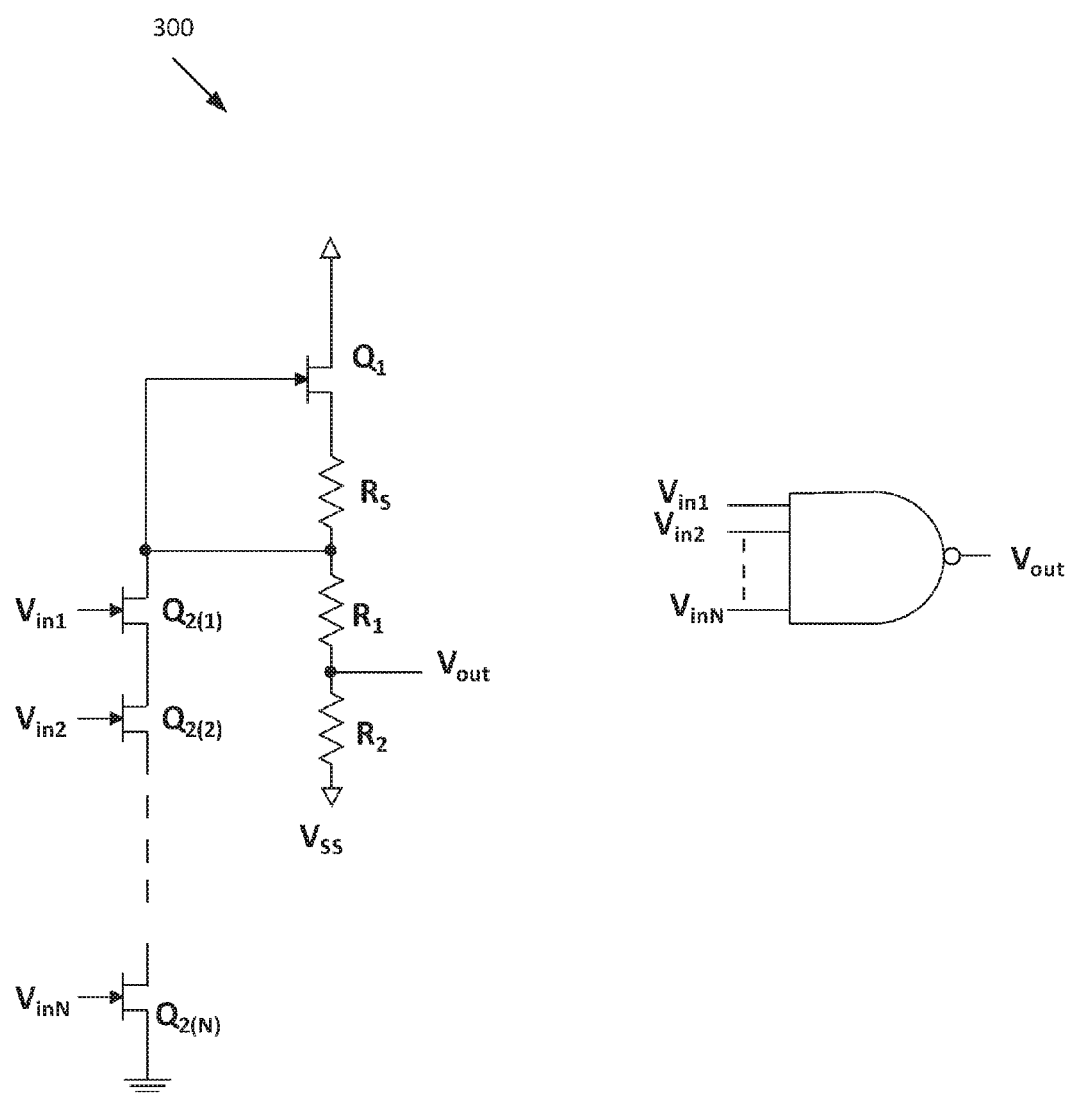

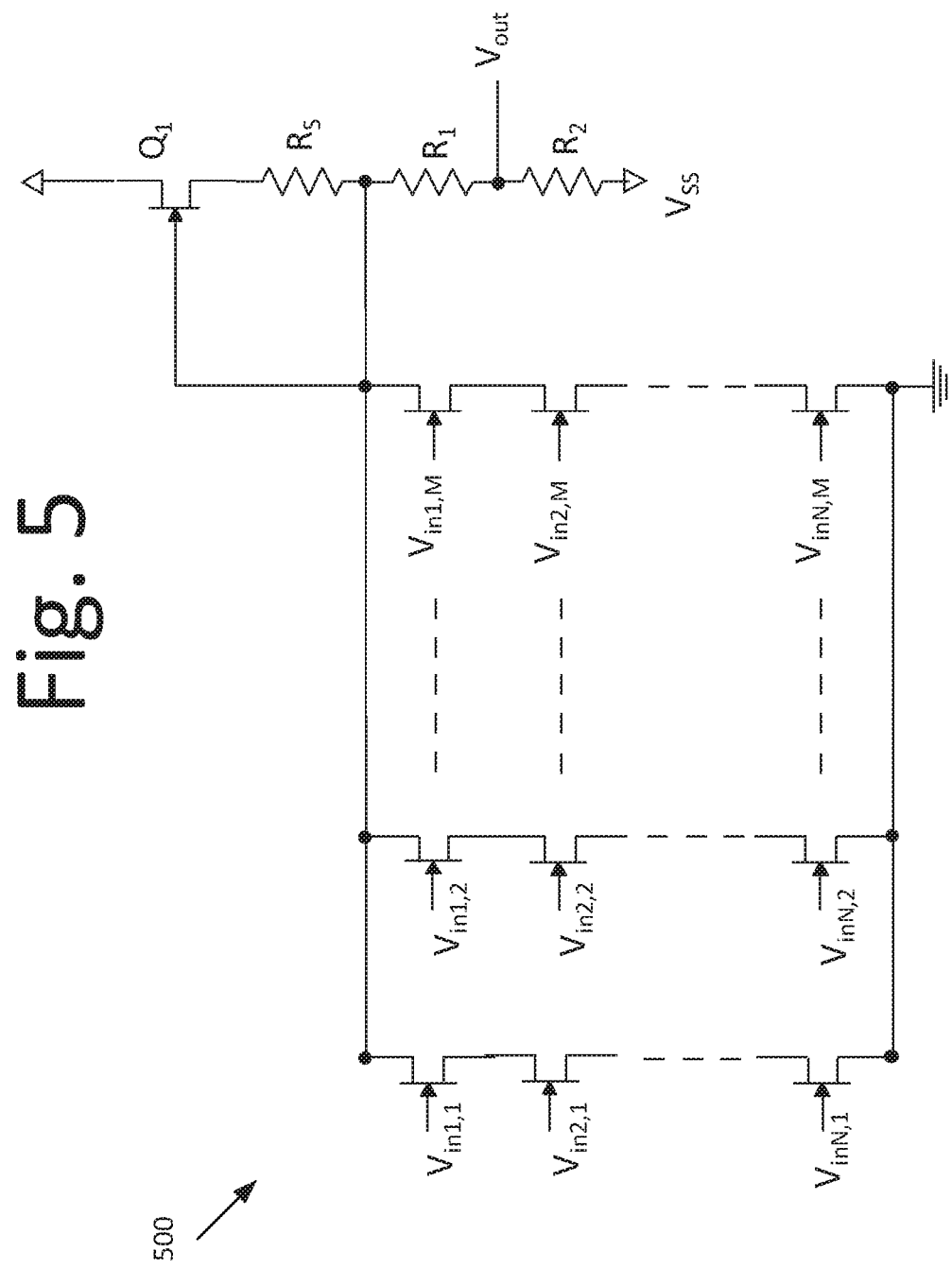

# CURRENT SOURCE LOGIC GATE

CROSS-REFERENCE TO RELATED APPLICATION

This application claims the benefit of U.S. Provisional Application Ser. No. 62/266,176 entitled "Current Source Logic Gate", filed on Dec. 11, 2015. The entirety of the above-noted application is incorporated by reference herein.

ORIGIN OF THE INVENTION

The invention described herein was made by employees of the United States Government and may be manufactured and used by or for the Government for Government purposes without the payment of any royalties thereon or therefor.

FIELD

The present invention relates to a logic gate, and more particularly, to a logic gate circuit having a depletion mode metal-semiconductor field effect transistor (MESFET) and/or junction gate field effect transistor (JFET) transistors and resistors.

BACKGROUND

Silicon Carbide (SiC) integrated circuit (IC) process is capable of operating at very high temperatures. This process, however, is only capable of producing depletion mode n-channel MESFET transistors. Thus, designing a logic gate with only this type of transistor may present a challenge.

An alternative design improving the output voltage range and decreasing the physical layout size of the logic gate may be beneficial.

SUMMARY

Certain embodiments of the present invention may provide solutions to the problems and needs in the art that have not yet been fully identified, appreciated, or solved by current logic gate designs. For example, some embodiments generally pertain to a logic gate circuit comprising a depletion mode MESFET/JFET transistors and resistors. These transistors and resistors may be constructed with SiC depletion mode n-channel MESFETS in some embodiments.

In one embodiment, an apparatus may create digital logic gates. The apparatus may include a first N channel depletion mode field effect transistor (or first transistor) with gate, source, and drain terminals. The gate terminal may act as an input to the apparatus. The apparatus may also include a second N channel depletion mode field effect transistor (or second transistor) with gate, source, and drain terminals, configured as a current source. The drain terminal of the second transistor may be tied to a positive voltage relative to ground. The source terminal of the first transistor is tied to ground and the drain terminal of the first transistor tied through a first resistor to the source terminal of the second transistor and directly to the gate terminal of the second transistor, for example. The drain of the first transistor is further tied to a second resistor in series with a third resistor, a remaining lead of the third resistor is tied to a negative voltage relative to ground, and a node common to the second and third resistors is the output of the apparatus.

In another embodiment, an apparatus may include a current source that includes a transistor and a current source resistor, and a current steering switch input stage that includes a transistor to steer current to set an output stage bias point depending on an input logic signal state. The apparatus also includes a resistor divider level shifting output stage comprising a first resistor and a second resistor to set the output stage point and produce valid output logic signal states. The transistor of the current steering switch input stage may function as a switch to provide at least two operating points.

In yet another embodiment, a current source logic gate with depletion mode FET transistors and resistors may include a first N channel depletion mode FET (or a first transistor) with gate, source, and drain terminals and a second N channel depletion mode FET (or a second transistor) with gate, source, and drain terminals. The first transistor is configured to act as a current source, and is positioned above the second transistor. The drain terminal of the first transistor is tied to a positive voltage relative to ground, and the gate terminal of the second transistor acts as an input to the current source logic gate. The source terminal of the second transistor is tied to ground, and the drain terminal of the second transistor is tied through a first resistor to the source terminal of the first transistor and directly to the gate terminal of the first transistor. The drain of the second transistor is further tied to a second resistor in series with a third resistor, a remaining lead of the third resistor is tied to a negative voltage relative to ground, and a node common to the second and third resistors is the output of the current source logic gate.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which:

FIGS. 3-5 are circuit diagrams illustrating a current source logic gate, according to an embodiment of the present invention.

DETAILED DESCRIPTION OF THE EMBODIMENTS

Figure 1:
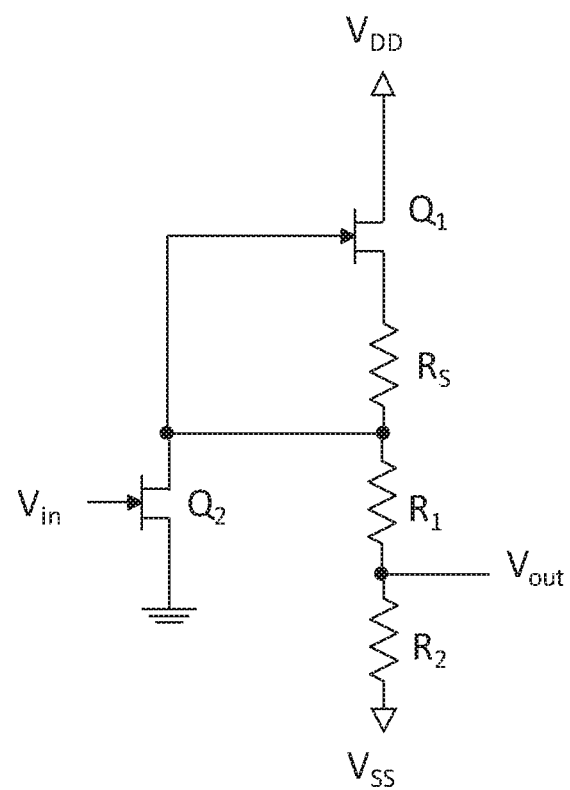
FIG. 1 is a circuit diagram illustrating a current source logic gate, according to an embodiment of the present invention.

In some embodiments, an apparatus may create digital logic gates. The apparatus may include a first N channel depletion mode FET (or a first transistor) with gate, source, and drain terminals and a second N channel depletion mode FET (or a second transistor) with gate, source, and drain terminals. The first transistor is configured to act as a current source, and is positioned above the second transistor. The drain terminal of the first transistor is tied to a positive voltage relative to ground, and the gate terminal of the second transistor acts as an input to the current source logic gate. The source terminal of the second transistor is tied to ground, and the drain terminal of the second transistor is tied through a first resistor to the source terminal of the first transistor and directly to the gate terminal of the first transistor. The drain of the second transistor is further tied to a second resistor in series with a third resistor, a remaining lead of the third resistor is tied to a negative voltage relative to ground, and a node common to the second and third resistors is the output of the current source logic gate.

In certain embodiments, the first, second, and third resistors are selected based on transfer functions or functional parameters of the first and second transistors such that for a logic false input to the apparatus, a logic true output appears at the output, or for a logic false input to the apparatus, a logic true output appears at the output. For example, common and pertinent transistor transfer functions and functional parameters include transconductance, gate-to-source turn off voltage, drain-to-source resistance, etc. Common and pertinent transistor transfer functions and functional parameters may also include any process or material variables such as channel doping, gate characteristics, carrier mobility, physical geometry of the transistor, etc.

Also, in some embodiments, the second transistor is replaced by n N channel depletion mode field effect transistor in series to create a logical NAND structure at the input of the apparatus. In another embodiment, the second transistor is replaced by m N channel depletion mode field effect transistor in parallel to create a logical NOR structure at the input of the apparatus. In yet some other embodiments, the second transistor is replaced by a combination of n series N channel depletion mode field effect transistors and m parallel N channel depletion mode field effect transistors to create multiple term sum of products logic functions.

Certain embodiments may include a logic gate circuit that includes a depletion mode MESFET/JFET transistors and resistors. These transistors and resistors may be constructed with SiC depletion mode n-channel MESFETS in some embodiments. The logic gate circuit may include three circuit constructs, for example. The first construct may include a current source with one transistor and one resistor. The second construct may include a current steering switch input stage having at least one transistor, and the third construct may include a resistor divider level shifting output stage.

FIG. 1 is a circuit diagram illustrating a current source logic gate 100, according to an embodiment of the present invention. In some embodiments, current source logic gate 100 may include a current source ($Q_1$ and $R_S$), a current steering switch input stage ($Q_2$), and a resistor divider level shifting output stage ($R_1$ and $R_2$).

Current source may be comprised of first transistor $Q_1$ and current source resistor $R_S$ to provide current, biasing the output stage and limiting the total device current in current source logic gate 100. The current steering input stage of second transistor $Q_2$ may steer the current to set the output stage bias point depending on input logic signal state. Finally, the resistor divider level shifting output stage, which may be comprised of first and second resistors $R_1$ and $R_2$, sets the output stage bias points and further develops valid output logic signal states.

In FIG. 1, current source logic gate 100 may have two operating points, e.g., logic high input and a logic low input. As the basis gate for logic functions, the simplest function performed by current source logic gate 100 is the inverting or NOT function, which results in a logic high output $V_{out}$ for a logic low input $V_{in}$, and conversely, a logic low output $V_{out}$ for logic high input $V_{in}$.

Figure 2B:
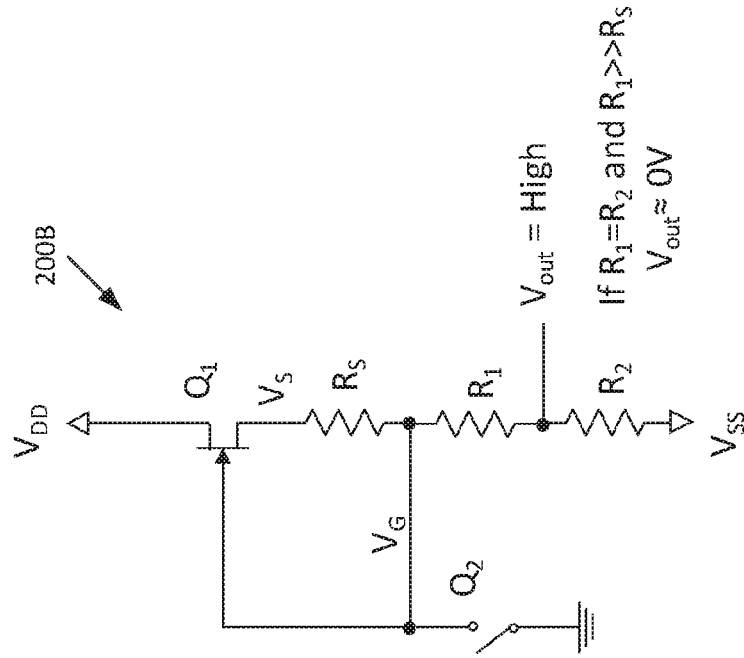
FIGS. 2A and 2B are circuit diagrams illustrating an input high-output low and an input low-output high, respectively, according to an embodiment of the present invention.

As an inverting logic gate and by treating transistor $Q_2$ at the current steering switch input stage as a switch, current source logic gate may have two ideal operating points. These ideal operating points may illustrate optimal circuit operation. Even though the realized circuit operating points may differ from the ideal cases, the operation is similar. In some embodiments, the logic level high refers to 0V, and the logic level low refers to a negative voltage equal to ½ $V_{SS}$. The two operating points of logic high output and logic low output are shown in FIGS. 2A and 2B respectively, which are circuit diagrams illustrating an input high-output low by current source logic gate 200A and an input low-output high by current source logic gate 200B, according to an embodiment of the present invention.

Figure 2A:
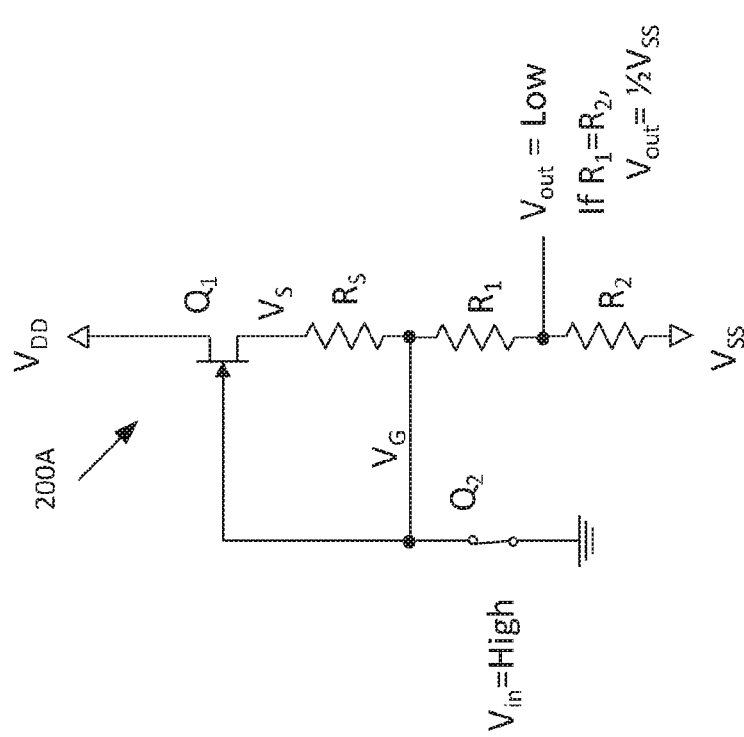

In FIG. 2A, voltage input $V_{in}$ is logic 1 or HIGH, that is at ground potential ($V_{gs}$ of transistor $Q_2$=0) turning on transistor $Q_2$ and closing the switch at transistor $Q_2$. This shorts transistor $Q_2$, connecting voltage $V_G$ to ground, steering the current source current to transistor $Q_2$. Output voltage $V_{out}$ is set by supply source voltage $V_{SS}$ and the voltage divider of resistor $R_1$ and resistor $R_2$.

$$V_{out} = (0 - V_{SS}) \cdot \frac{R_2}{R_1 + R_2} + V_{SS} \qquad \text{Equation (1)}$$

and if resistor $R_1$=resistor $R_2$, then $$V_{out} = \frac{1}{2} V_{SS} \qquad \text{Equation (2)}$$

which represents a logic 0 or low.

In FIG. 2B, the input voltage $V_{in}$ is logic 0 or LOW, that is at a potential sufficiently negative to fully turn off the transistor $Q_2$, or opening the switch at transistor $Q_2$, steering the current source current to the output stage. In other words, the magnitude of the gate to source voltage $V_{gs}$ of transistor $Q_2 \geq$ the turn off gate to source voltage $V_{gs(off)}$. This may disconnect voltage $V_G$ from ground, allowing voltage $V_G$ to move to a self-bias point away from ground and toward drain supply voltage $V_{DD}$ as set by the current source of transistor $Q_1$ and current source resistor $R_S$, and the output resistors $R_1$ and $R_2$. If current source resistor $R_S$ is much smaller than resistors $R_1$ and $R_2$ and the voltage across the transistor $Q_1$ ($V_{DS}$) is small, and since $R_1$=$R_2$, voltage $V_G$ approaches drain supply voltage $V_{DD}$, and output voltage $V_{out}$ approaches 0V. In those embodiments, output voltage $V_{out}$=0 volts, which represents a logic 1 or HIGH.

The inverting logic gate operation may in some embodiments be expanded to NAND and NOR logic operations with the addition of transistors $Q_{2(1,1)} \ldots Q_{2(N,M)}$ to the current steering stage of the logic gate, that is to add transistors in parallel, series, or both with $Q_2$. See, for example, FIGS. 3-5, which are circuit diagrams illustrating current source logic gate, according to an embodiment of the present invention.

Figure 4:
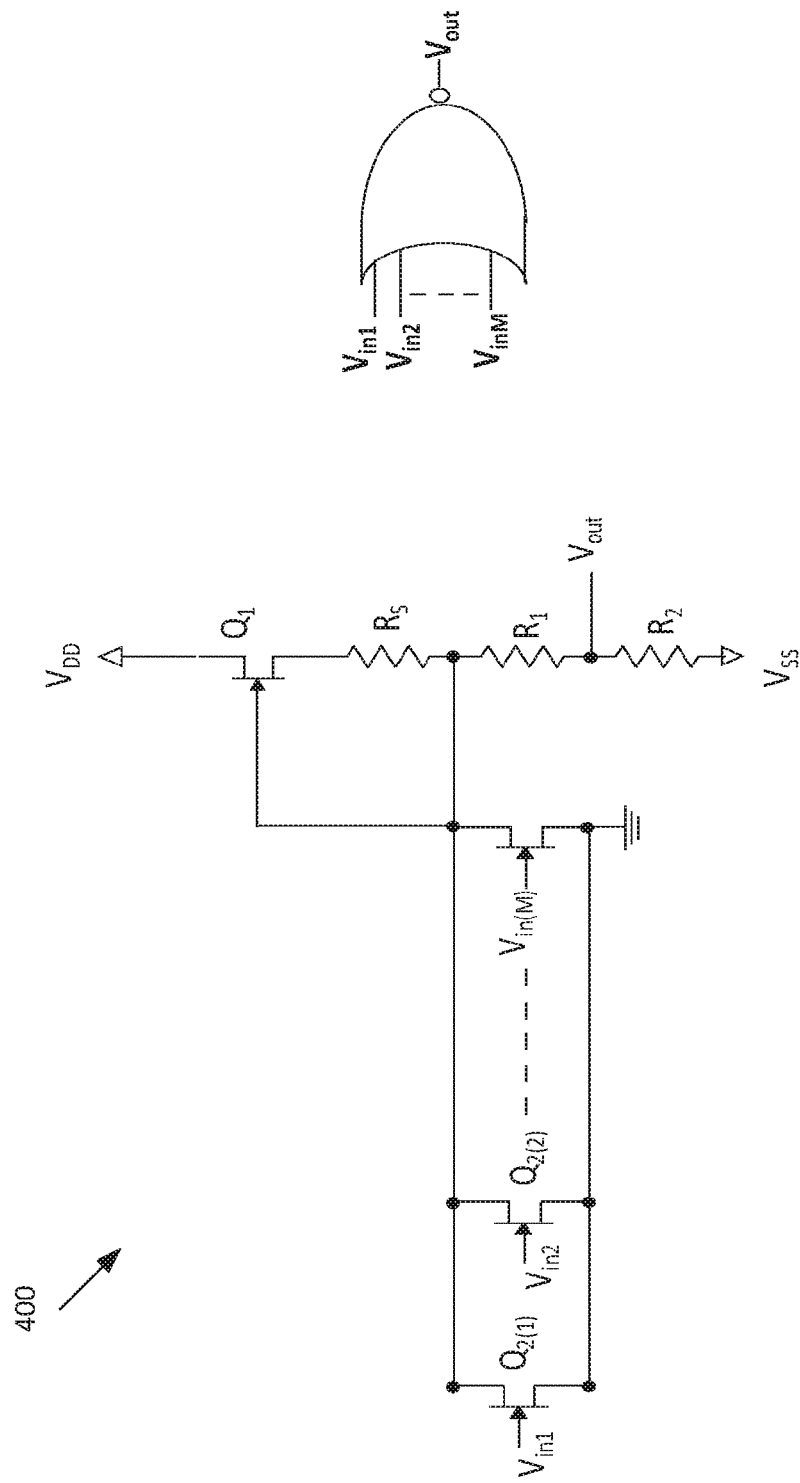

In FIG. 3, current source logic gate 300 may include additional transistors $Q_{2(1)} \ldots Q_{2(N)}$ connected in series to the current steering logic gate. In FIG. 4, for example, current source logic gate 400 may include additional transistors $Q_{2(1)} \ldots Q_{2(M)}$ connected in parallel to the current steering logic gate. In FIG. 5, additional transistors $V_{in1,2} \ldots V_{inN,M}$ connected in series and in parallel to the current steering logic gate.

The actual operation of current source logic gates 300-500, as shown in FIGS. 1 and 3-5, may differ from the ideal case depending on the parameters of the transistor. The parameters may be affected by the device physics, manufacturing process effects, material properties, and geometry. Furthermore, these parameters may be affected by the formation of complex logic gates such as sum of products. For example, transistor $Q_2$ may act as a switch, which when closed, may set the output at a voltage of ½ VSS. In practice, a transistor does not act like a switch in direct current (DC) analysis, because the transistor has a finite resistance. This finite resistance of transistor $Q_2$, i.e., the on resistance, has the benefit in the current source logic gate of limiting the logic gates current. This resistance may also increase the output voltage, which decreases the output voltage swing, reducing the noise margin of the current source logic gate.

The operation of the current source logic gate may be optimized through the choice in resistor values. As the current source resistor ($R_S$) controls the current provided by the current source (current source resistor $R_S$ and transistor $Q_1$) for a given transconductance. For example, reducing the current by increasing current source resistor $R_S$ may lessen the current through transistor $Q_2$. This may result in a decrease of the output voltage in the low state. This may also increase the output voltage swing, increasing the noise margin of the gate.

During operation, the logic high output shown in FIG. 2B, may also differ from the ideal case. For example, in FIG. 2B, the voltage dropped across current source resistor $R_S$ and transistor $Q_1$ appears to be negligible. This, however, may not be the case during operation of current source logic gate 200B, because resistors $R_1$ and $R_2$ may not be made large enough for this assumption. In practice, as current source resistor $R_S$ increases, the output voltage in the output high state may decrease, decreasing the noise margin. This effect can be compensated for by decreasing the ratio of resistor $R_1$ to resistor $R_2$, making resistor $R_1$ less than resistor $R_2$. This may also increase the output voltage in the high state for a given transconductance parameter and current source resistor $R_S$.

As the transistor parameters begin to influence the operation of the logic gate, the logic gate performance may be modified through the choice of resistor values. These resistor values give some control over the logic gate current and output voltage swing. Depending on the transistor parameters and application, resistor values may be selected to optimize logic gate performance.

It will be readily understood that the components of various embodiments of the present invention, as generally described and illustrated in the figures herein, may be arranged and designed in a wide variety of different configurations. Thus, the detailed description of the embodiments, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. An apparatus configured to create digital logic gates, comprising:
   a first N channel depletion mode field effect transistor ("first transistor") with gate, source, and drain terminals, wherein the gate terminal acts as an input to the apparatus; and
   a second N channel depletion mode field effect transistor ("second transistor") with gate, source, and drain terminals, configured as a current source, wherein
   the drain terminal of the second transistor is tied to a positive voltage relative to ground,
   the source terminal of the first transistor tied to ground and the drain terminal of the first transistor tied through a first resistor to the source terminal of the second transistor and directly to the gate terminal of the second transistor,
   and
   the drain of the first transistor is further tied to a second resistor in series with a third resistor, a remaining lead of the third resistor is tied to a negative voltage relative to ground, and a node common to the second and third resistors is the output of the apparatus.

2. The apparatus of claim 1, wherein the first, second and third resistors are selected based on transfer functions or functional parameters of the first and second transistors such that for a logic false input to the apparatus, a logic true output appears at the output of the apparatus, or for a logic true input to the apparatus, a logic false output appears at the output of the apparatus.

3. The apparatus of claim 1, wherein the first transistor is replaced by n N channel depletion mode field effect transistor in series to create a logical NAND structure at the input of the apparatus.

4. The apparatus of claim 1, wherein the first transistor is replaced by m N channel depletion mode field effect transistor in parallel to create a logical NOR structure at the input of the apparatus.

5. The apparatus of claim 1, wherein the first transistor is a combination of n series N channel depletion mode field effect transistors and m parallel N channel depletion mode field effect transistors to create multiple term sum of products logic functions.

6. The apparatus of claim 1, wherein a positive voltage and a negative voltage relative to ground are selected to accommodate a turn off voltage of the first transistor as reflected by a voltage divider function performed by the second and third resistors.

7. The apparatus of claim 6, wherein a value of the first resistor is selected to set a current output of the second transistor,
the current output is further selected in accordance with selected positive voltage and negative voltage and to define a value for the second resistor and a value for the third resistor.

8. A current source logic gate with depletion mode field effect transistor ("FET") transistors and resistors, comprising:
a current source comprising a transistor and a current source resistor;
a current steering switch input stage comprising a transistor to steer current to set an output stage bias point depending on an input logic signal state; and
a resistor divider level shifting output stage comprising a first resistor and a second resistor to set the output stage point and produce valid output logic signal states, wherein
the transistor of the current steering switch input stage functions as a switch to provide at least two operating points.

9. The current source logic gate of claim 8, wherein the two operating points comprises a logic level high and a logic level low.

10. The current source logic gate of claim 9, wherein,
when the operating point comprises the logic level high at the input stage of the current steering switch, a logic low output appears at an output stage of the current source logic gate, or
when the operating point comprises the logic level low at the input stage of the current steering switch, a logic high output appears at the output stage of the current source logic gate.

11. The current source logic gate of claim 8, wherein the current steering switch input stage comprises one or more additional transistors connected in parallel, in series, or both.

12. The current source logic gate of claim 8, wherein the current steering switch input stage acts as a switch to limit logic gate current.

13. The current source logic gate of claim 8, wherein the current source resistor of the current source controls current provided by the current source.

14. A current source logic gate with depletion mode field effect transistor ("FET") transistors and resistors, comprising:
a first N channel depletion mode FET ("first transistor") with gate, source, and drain terminals; and
a second N channel depletion mode FET ("second transistor") with gate, source, and drain terminals, wherein
the first transistor is configured to act as a current source, and is positioned above the second transistor,
the drain terminal of the first transistor is tied to a positive voltage relative to ground,
the gate terminal of the second transistor acts as an input to the current source logic gate,
the source terminal of the second transistor is tied to ground, and the drain terminal of the second transistor is tied through a first resistor to the source terminal of the first transistor and directly to the gate terminal of the first transistor, and
the drain of the second transistor is further tied to a second resistor in series with a third resistor, a remaining lead of the third resistor is tied to a negative voltage relative to ground, and a node common to the second and third resistors is the output of the current source logic gate.

15. The current source logic gate of claim 14, wherein the first resistor, the second resistor, and the third resistor are selected based on transfer functions or functional parameters of the first and second transistors such that for a logic false input to the current source logic gate, a logic true output appears at the output of the current source logic gate, or for a logic true input to the current source logic gate, a logic false output appears at the output of the current source logic gate.

16. The current source logic gate of claim 14, wherein the second transistor is replaced by n N channel depletion mode field effect transistor in series to create a logical NAND structure at the input of the current source logic gate.

17. The current source logic gate of claim 14, wherein the second transistor is replaced by m N channel depletion mode field effect transistor in parallel to create a logical NOR structure at the input of the current source logic gate.

18. The current source logic gate of claim 14, wherein the second transistor is a combination of n series N channel depletion mode field effect transistors and m parallel N channel depletion mode field effect transistors to create multiple term sum of products logic functions.

19. The current source logic gate of claim 14, wherein a positive voltage and a negative voltage relative to ground are selected to accommodate a turn off voltage of the second transistor as reflected by a voltage divider function performed by the second and third resistors.

20. The current source logic gate of claim 19, wherein a value of the first resistor is selected to set a current output of the first transistor,
the current output is further selected in accordance with selected positive voltage and negative voltage and to define a value for the second resistor and a value for the third resistor.

* * * * *